(12) United States Patent
Wang et al.

(10) Patent No.: US 7,872,292 B2
(45) Date of Patent: Jan. 18, 2011

(54) CAPACITANCE DIELECTRIC LAYER AND CAPACITOR

(75) Inventors: Chih-Chun Wang, Jhonghe (TW); Hsin-Hsing Chen, Pingtung (TW); Yu-Ho Chiang, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 348 days.

(21) Appl. No.: 11/358,972

(22) Filed: Feb. 21, 2006

(65) Prior Publication Data

US 2007/0196977 A1    Aug. 23, 2007

(51) Int. Cl.
*H01L 27/108* (2006.01)

(52) U.S. Cl. ........................ 257/306; 257/310; 257/637; 257/640; 257/E29.343

(58) Field of Classification Search ................ 257/296, 257/310, 301, 303, 306, 532, 535, 635–637, 257/640, 649, E29.343, E29.345
See application file for complete search history.

(56) References Cited

U.S. PATENT DOCUMENTS

| | | | | |
|---|---|---|---|---|
| 5,498,890 A | * | 3/1996 | Kim et al. | 257/310 |
| 6,163,050 A | * | 12/2000 | Hisatomi et al. | 257/324 |
| 6,200,852 B1 | * | 3/2001 | Lou et al. | 438/253 |
| 6,680,500 B1 | * | 1/2004 | Low et al. | 257/295 |
| 2004/0141390 A1 | * | 7/2004 | Won et al. | 365/200 |

FOREIGN PATENT DOCUMENTS

TW          418529          1/2001

* cited by examiner

*Primary Examiner*—Matthew E Warren
(74) *Attorney, Agent, or Firm*—J.C. Patents (57) ABSTRACT

A capacitance dielectric layer is provided. The capacitance dielectric layer includes a first dielectric layer, a second dielectric layer and a silicon nitride stacked layer. The silicon nitride stacked layer is disposed between the first dielectric layer and the second dielectric layer. The structure of the capacitance dielectric layer permits an increase in the capacitance per unit area by decreasing the thickness of the capacitance dielectric layer and eliminates the problems of having a raised leakage current and a diminished breakdown voltage.

18 Claims, 7 Drawing Sheets

CAPACITANCE DIELECTRIC LAYER AND CAPACITOR

BACKGROUND OF THE INVENTION

1. Field of the Invention

The present invention relates to a semiconductor device and forming method thereof. More particularly, the present invention relates to a capacitance dielectric layer, a forming method thereof and a capacitor.

2. Description of the Related Art

In recent years, with the rapid development of integrated circuit manufacturing industry, the miniaturization of devices and the increase in the level of integration continue unabated. As a result, the design of circuit devices is advancing toward ever-decreasing dimensions.

Figure 1:
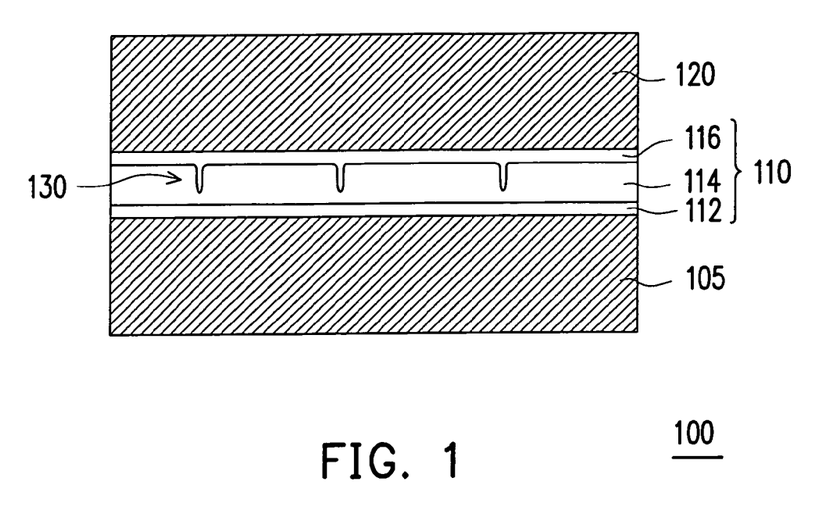
FIG. 1 is a schematic cross-sectional view of a conventional capacitor.

FIG. 1 is a schematic cross-sectional view of a conventional capacitor. In general, a capacitor 100 mainly comprises a bottom electrode plate 105, a capacitance dielectric layer 110 and a top electrode plate 120. The top electrode plate 120 and the bottom electrode plate 105 are mostly fabricated using polysilicon. The capacitance dielectric layer 110 is normally a three-layered structure comprising a silicon oxide layer 112, a silicon nitride layer 114 and another silicon oxide layer 116. This kind of dielectric layer structure is often referred to as an oxide/nitride/oxide (ONO) composite structure.

It should be noted that with the continuous reduction in device dimension, the capacitor structure inside some mixed mode devices or radio frequency (RF) devices may encounter the problem of not having enough per unit capacitance. To resolve this problem, it is customary to reduce the thickness of the capacitance dielectric layer so that the per-unit capacitance of the capacitor can increase.

However, as shown in FIG. 1, the thickness of the capacitance dielectric layer 110 is mainly contributed by the silicon nitride layer 114 disposed in the middle of the capacitor 100. At present, most capacitance dielectric layer is formed in a single one-time deposition process. If the thickness of the capacitance dielectric layer is directly reduced using the same process, significant number of defects 130 such as seams or pinholes can easily form in the capacitance dielectric layer, particularly, the silicon nitride portion. These defects will serve as pathways for leakage currents so that the leakage current will increase and the breakdown voltage of the capacitor will reduce. Ultimately, data may be lost and the processing reliability and yield may be affected.

SUMMARY OF THE INVENTION

Accordingly, at least one objective of the present invention is to provide a capacitance dielectric layer capable of preventing the problems of having an increase in the leakage current and a decrease in the breakdown voltage when the thickness of the capacitance dielectric layer is reduced to increase the capacitance per unit area.

At least another objective of the present invention is to provide a method of forming a capacitance dielectric layer that utilizes a multiple deposition process to form a silicon nitride stacked layer to prevent the problems of having an increase in the leakage current and a decrease in the breakdown voltage when the thickness of the capacitance dielectric layer is reduced to increase the capacitance per unit area.

At least another objective of the present invention is to provide a capacitor capable of preventing an increase in the leakage current and a decrease in the breakdown voltage and yet capable of increasing the capacitance per unit area.

To achieve these and other advantages and in accordance with the purpose of the invention, as embodied and broadly described herein, the invention provides a capacitance dielectric layer. The capacitance dielectric layer comprises a first dielectric layer; a second dielectric layer and a silicon nitride stacked layer. The silicon nitride stacked layer is disposed between the first dielectric layer and the second dielectric layer.

In one embodiment of the present invention, the aforementioned silicon nitride stacked layer comprises a first silicon nitride layer and a second silicon nitride layer. In one embodiment, the silicon nitride stacked layer may also include a third silicon nitride layer disposed between the first silicon nitride layer and the second silicon nitride layer.

According to one embodiment of the present invention, the aforementioned first dielectric layer and the second dielectric layer can be fabricated using a material selected from a group consisting of silicon oxide (SiO), silicon nitride (SiN), silicon carbide (SiC), silicon oxynitride (SiON), silicon carbon nitride (SiCN) and silicon carbon oxide (SiCO).

According to one embodiment of the present invention, the capacitance dielectric layer further includes a third dielectric layer disposed between the first dielectric layer and the silicon nitride stacked layer. The third dielectric layer can be fabricated using a material selected from a group consisting of silicon oxide, silicon nitride, silicon carbide, silicon oxynitride, silicon carbon nitride and silicon carbon oxide.

According to one embodiment of the present invention, the capacitance dielectric layer further includes a fourth dielectric layer disposed between the second dielectric layer and the silicon nitride stacked layer. The fourth dielectric layer can be fabricated using a material selected from a group consisting of silicon oxide, silicon nitride, silicon carbide, silicon oxynitride, silicon carbon nitride and silicon carbon oxide. In one embodiment, beside the fourth dielectric layer, the capacitance dielectric layer further includes a fifth dielectric layer disposed between the first dielectric layer and the silicon nitride stacked layer. The fifth dielectric layer can be fabricated using a material selected from a group consisting of silicon oxide, silicon nitride, silicon carbide, silicon oxynitride, silicon carbon nitride and silicon carbon oxide.

The present invention also provides a method of forming a capacitance dielectric layer. The method includes forming a silicon nitride stacked layer over a first dielectric layer and then forming a second dielectric layer over the silicon nitride stacked layer.

According to one embodiment of the present invention, the method of forming the aforementioned silicon nitride stacked layer includes, for example, performing a chemical vapor deposition process to form a first silicon nitride layer over the first dielectric layer. Thereafter, another chemical vapor deposition process is performed to form a second silicon nitride layer over the first silicon nitride layer.

According to one embodiment of the present invention, the method of forming the aforementioned silicon nitride stacked layer includes performing a number of chemical vapor deposition processes consecutively, for example.

According to one embodiment of the present invention, the method of forming the aforementioned first dielectric layer and second dielectric layer includes performing a chemical vapor deposition process, for example.

According to one embodiment of the present invention, the aforementioned first dielectric layer, the second dielectric layer and the silicon nitride stacked layer can be fabricated in the same reaction chamber. In another embodiment, the first dielectric layer, the second dielectric layer and the silicon nitride stacked layer can be fabricated in different reaction chambers.

According to one embodiment of the present invention, the aforementioned first dielectric layer and second dielectric layer can be fabricated using a material selected from a group consisting of silicon oxide, silicon nitride, silicon carbide, silicon oxynitride, silicon carbon nitride and silicon carbon oxide.

According to one embodiment of the present invention, before forming the aforementioned silicon nitride stacked layer, further includes forming a third dielectric layer over the first dielectric layer. The third dielectric layer can be fabricated using a material selected from a group consisting of silicon oxide, silicon nitride, silicon carbide, silicon oxynitride, silicon carbon nitride and silicon carbon oxide.

According to one embodiment of the present invention, in the aforementioned method of forming the capacitance dielectric layer, after forming the silicon nitride stacked layer but before forming the second dielectric layer further includes forming a fourth dielectric layer over the silicon nitride stacked layer. The fourth dielectric layer can be fabricated using a material selected from a group consisting of silicon oxide, silicon nitride, silicon carbide, silicon oxynitride, silicon carbon nitride and silicon carbon oxide. In another embodiment, beside the fourth dielectric layer, after forming the first dielectric layer but before forming the silicon nitride stacked layer further includes forming a fifth dielectric layer over the first dielectric layer. The fifth dielectric layer can be fabricated using a material selected from a group consisting of silicon oxide, silicon nitride, silicon carbide, silicon oxynitride, silicon carbon nitride and silicon carbon oxide.

The present invention also provides a capacitor. The capacitor comprises a first electrode plate, a first dielectric layer, a second dielectric layer, a second electrode plate and a silicon nitride stacked layer. The first dielectric layer is disposed above the first electrode plate. The second dielectric layer is disposed above the first dielectric layer. The second electrode plate is disposed above the second dielectric layer. The silicon nitride stacked layer is disposed between the first dielectric layer and the second dielectric layer.

According to one embodiment of the present invention, the aforementioned silicon nitride stacked layer comprises a first silicon nitride layer and a second silicon nitride layer.

According to one embodiment of the present invention, the capacitor further includes at least a third silicon nitride layer disposed between the first silicon nitride layer and the second silicon nitride layer.

According to one embodiment of the present invention, the aforementioned first dielectric layer and the second dielectric layer can be fabricated using a material selected from a group consisting of silicon oxide, silicon nitride, silicon carbide, silicon oxynitride, silicon carbon nitride and silicon carbon oxide.

According to one embodiment of the present invention, the capacitor further includes a third dielectric layer disposed between the first dielectric layer and the silicon nitride stacked layer. The third dielectric layer can be fabricated using a material selected from a group consisting of silicon oxide, silicon nitride, silicon carbide, silicon oxynitride, silicon carbon nitride and silicon carbon oxide.

According to one embodiment of the present invention, the capacitor further includes a fourth dielectric layer disposed between the second dielectric layer and the silicon nitride stacked layer. The fourth dielectric layer can be fabricated using a material selected from a group consisting of silicon oxide, silicon nitride, silicon carbide, silicon oxynitride, silicon carbon nitride and silicon carbon oxide. In another embodiment, beside the fourth dielectric layer, the capacitor further includes a fifth dielectric layer disposed between the first dielectric layer and the silicon nitride stacked layer. The fifth dielectric layer can be fabricated using a material selected from a group consisting of silicon oxide, silicon nitride, silicon carbide, silicon oxynitride, silicon carbon nitride and silicon carbon oxide.

According to one embodiment of the present invention, the aforementioned first electrode plate and the second electrode plate are fabricated using a metallic material, for example. The metallic material includes titanium nitride (TiN), titanium (Ti), aluminum (Al), copper (Cu) or other combination of materials, for example.

This present invention utilizes the performance of a multiple of consecutive deposition processes to form the silicon nitride stacked layer. Although each silicon nitride layer in the silicon nitride stacked layer may have a number of defects, these defects will be randomly distributed. Hence, the problems of having an increase in the leakage current and the drop in breakdown voltage can be avoided. As a result, the present invention can reduce the thickness of the capacitance dielectric layer and increase the per unit area capacitance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
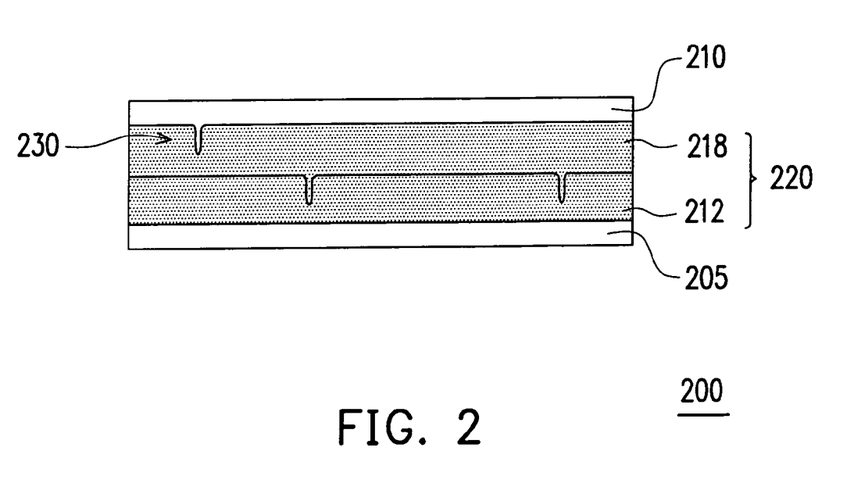
FIGS. 2, 3, 4, 5, 6 and 7 are schematic cross-sectional views of a capacitance dielectric layer according to the embodiments of the present invention.

FIG. 2 is schematic cross-sectional view of a capacitance dielectric layer according to one embodiment of the present invention. The capacitance dielectric layer 200 as shown in FIG. 2 includes a first dielectric layer 205, a second dielectric layer 210 and a silicon nitride stacked layer 220. The first dielectric layer 205 can be fabricated using a material selected from a group consisting of silicon oxide, silicon nitride, silicon carbide, silicon oxynitride, silicon carbon nitride and silicon carbon oxide, for example. Similarly, the second dielectric layer 210 can be fabricated using a material selected from a group consisting of silicon oxide, silicon nitride, silicon carbide, silicon oxynitride, silicon carbon nitride and silicon carbon oxide too. Obviously, the first dielectric layer 205 and the second dielectric layer 210 can be fabricated using some other dielectric materials. The first dielectric layer 205 has a thickness between about 90 Å to 110 Å and the second dielectric layer 210 has a thickness between about 90 Å to 110 Å, for example. Moreover, the first dielectric layer 205 and the second dielectric layer 210 can have an identical thickness or a different thickness.

As shown in FIG. 2, the silicon nitride stacked layer 220 is disposed between the first dielectric layer 205 and the second dielectric layer 210. The silicon nitride stacked layer has a thickness between about 110 Å to 150 Å and comprises a first silicon nitride layer 212 and a second silicon nitride layer 218, for example.

Figure 3:
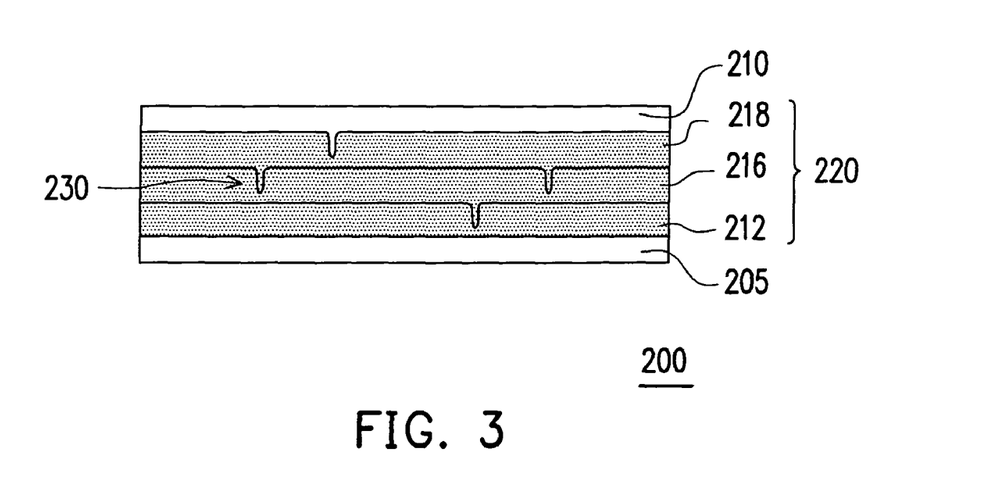
Figure 4:
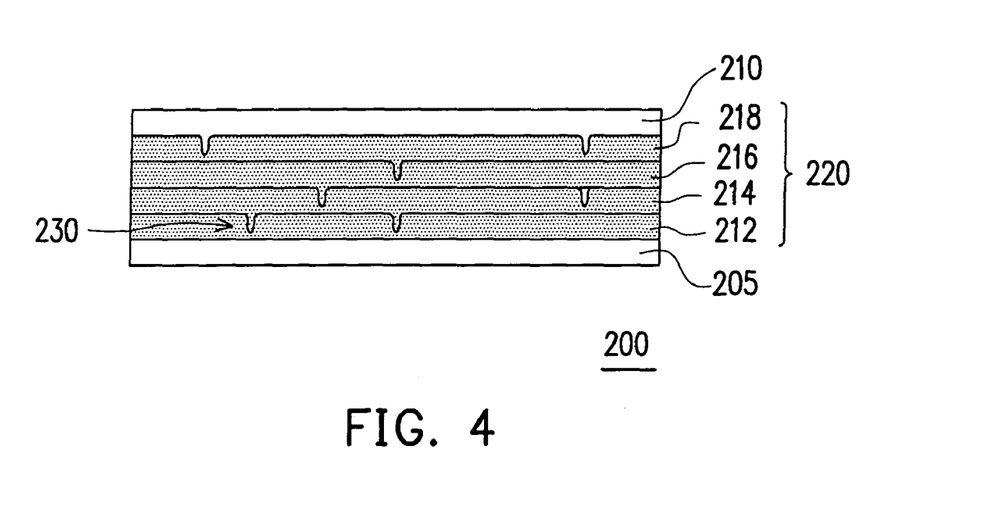

In another embodiment of the present invention, the silicon nitride stacked layer 220 can have a three-layered structure. As shown in FIG. 3, the silicon nitride stacked layer 220 comprises silicon nitride layers 212, 216 and 218, for example. In yet another embodiment of the present invention, the silicon nitride stacked layer 220 can have a four-layered structure. As shown in FIG. 4, the silicon nitride stacked layer 220 comprises silicon nitride layers 212, 214, 216 and 218, for example. The foregoing embodiments should by no means limit the scope of the present invention. The silicon nitride stacked layer 220 can comprise any number of silicon nitride layers according to the actual demand.

It should be noted that each silicon nitride layer in the silicon nitride stacked layer 220 of the capacitance dielectric layer 220 may have some defects 230 including seams or pinholes. Because the silicon nitride stacked layer 220 comprises a plurality of silicon nitride layer, the defects 230 in the silicon nitride layers are randomly positioned. Such an organization of defects 230 can prevent the problem of having an increase in the leakage current and a decrease in the breakdown voltage and limit the effects of the defects 230 in the processing reliability and yield. In other words, besides reducing the thickness of the capacitance dielectric layer and increasing the per unit capacitance of the capacitance dielectric layer, the present invention also minimizes leakage current and reduces the drop in breakdown voltage.

Figure 5:
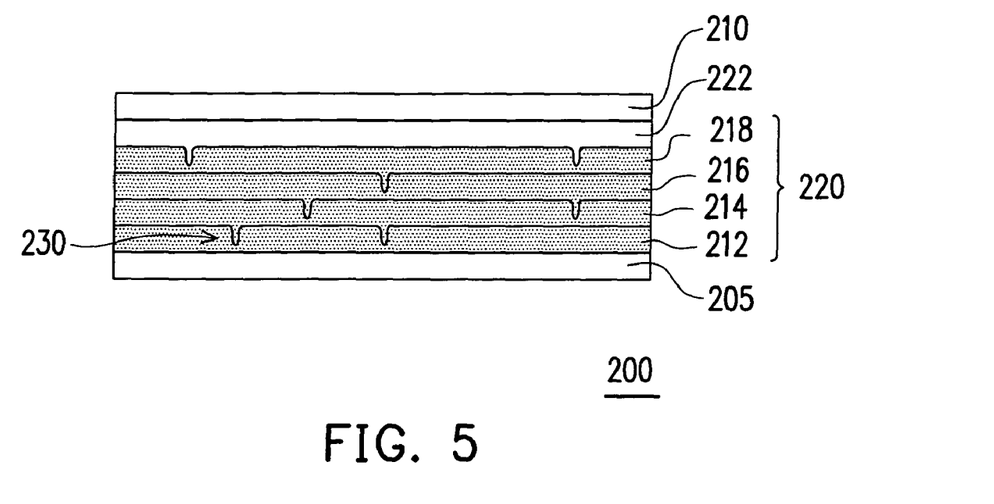
Figure 6:
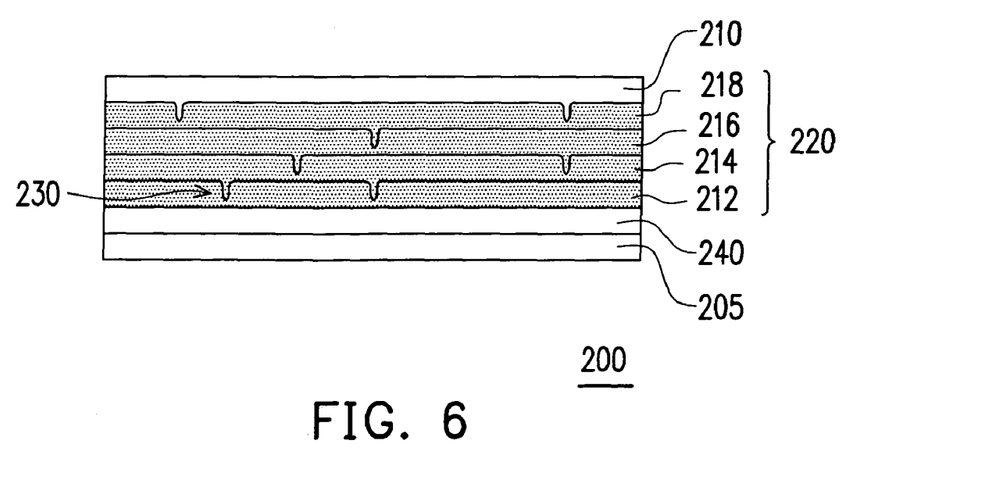
Figure 7:
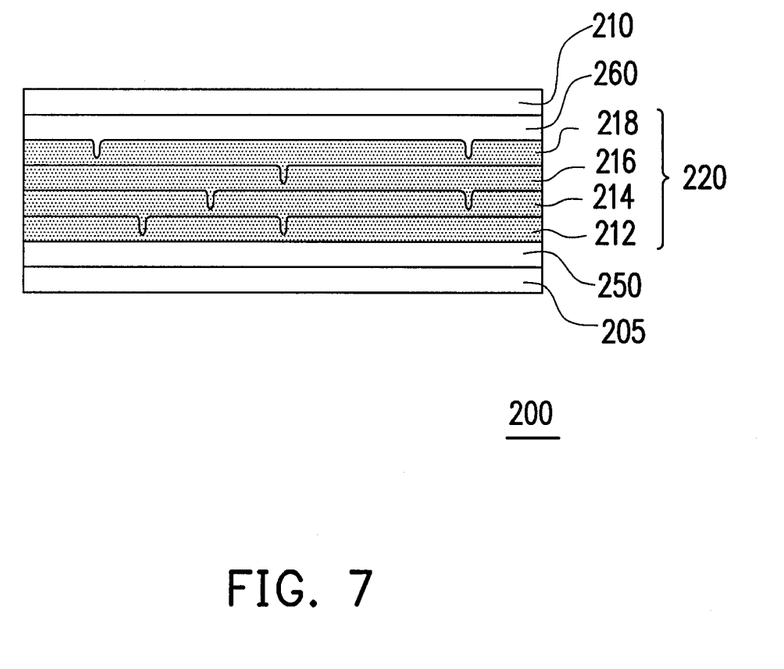

In another embodiment shown in FIG. 5, the capacitance dielectric layer 200 may further include a dielectric layer 222 disposed between the dielectric layer 210 and the silicon nitride stacked layer 220. The dielectric layer 222 can be fabricated using a material including silicon oxide, silicon nitride, silicon carbide, silicon oxynitride, silicon carbon nitride or silicon carbon oxide, for example. In yet another embodiment as shown in FIG. 6, the capacitance dielectric layer 200 of the present invention may include another dielectric layer 240 disposed between the dielectric layer 205 and the silicon nitride stacked layer 220. The aforementioned dielectric layer 240 can be fabricated using a material including silicon oxide, silicon nitride, silicon carbide, silicon oxynitride, silicon carbon nitride or silicon carbon oxide, for example. In yet another embodiment as shown in FIG. 7, the capacitance dielectric layer 200 of the present invention may include a dielectric layer 250 and another dielectric layer 260. The dielectric layer 250 is disposed between the dielectric layer 205 and the silicon nitride stacked layer 220 and the dielectric layer 260 is disposed between the dielectric layer 210 and the silicon nitride stacked layer 220. The aforementioned dielectric layer 250 and dielectric layer 260 can be fabricated using a material including silicon oxide, silicon nitride, silicon carbide, silicon oxynitride, silicon carbon nitride or silicon carbon oxide, for example.

Figure 8A:
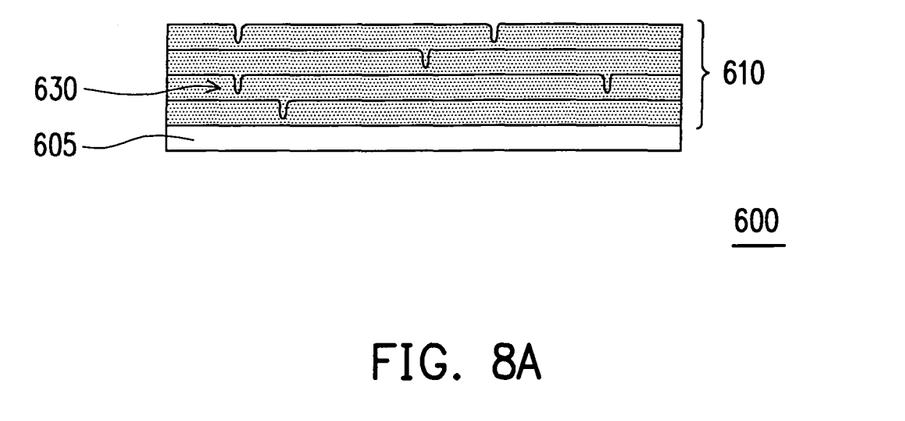
FIGS. 8A and 8B are schematic cross-sectional views showing the steps for forming a capacitor dielectric layer according to one embodiment of the present invention.
Figure 8B:
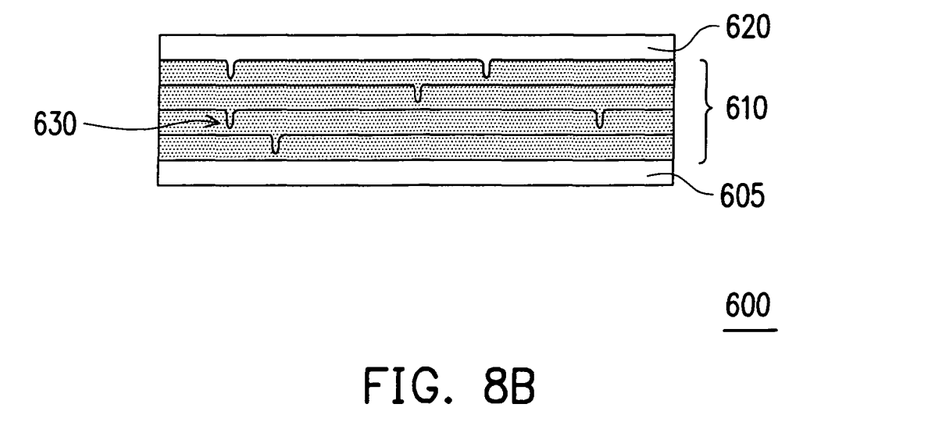

In the following, a method of forming the capacitance dielectric layer of the present invention is described. FIGS. 8A and 8B are schematic cross-sectional views showing the steps for forming a capacitor dielectric layer according to one embodiment of the present invention. First, as shown in FIG. 8A, a dielectric layer 605 is formed over a material layer (not shown). The material layer can be a substrate with devices already formed thereon, for example. The dielectric layer 605 is formed, for example, by performing a chemical vapor deposition process using a material selected from a group consisting of silicon oxide, silicon nitride, silicon carbide, silicon oxynitride, silicon carbon nitride and silicon carbon oxide. The dielectric layer 605 has a thickness between about 90 Å to 110 Å, for example.

As shown in FIG. 8A, a silicon nitride stacked layer 610 is formed over the dielectric layer 605. Each silicon nitride layer in the silicon nitride stacked layer 610 may includes a few defects 630 such as seams or pinholes. The silicon nitride stacked layer 610 has a thickness between about 110 Å to 150 Å, for example. The method of forming the silicon nitride stacked layer 610 includes, for example, performing a plurality of chemical vapor deposition processes consecutively.

More specifically, if the silicon nitride stacked layer 610 has two silicon nitride layers, the method of forming the silicon nitride stacked layer 610 includes, for example, performing a chemical vapor deposition process to form a silicon nitride layer over the dielectric layer 605. Then, another chemical vapor deposition process is performed to deposit another silicon nitride layer over the previous silicon nitride layer.

In one embodiment, before forming the silicon nitride stacked layer 610 further includes forming a dielectric layer (not shown) over the dielectric layer 605. The method of forming the dielectric layer includes, for example, performing a chemical vapor deposition process using a material selected from a group consisting of silicon oxide, silicon nitride, silicon carbide, silicon oxynitride, silicon carbon nitride and silicon carbon oxide.

As shown in FIG. 8B, a dielectric layer 620 is deposited over the silicon nitride stacked layer 610 to form a capacitor dielectric layer 600. The method of forming the dielectric layer 620 includes, for example, performing a chemical vapor deposition process using a material selected from a group consisting of silicon oxide, silicon nitride, silicon carbide, silicon oxynitride, silicon carbon nitride and silicon carbon oxide. The dielectric layer 620 has a thickness between about 90 Å to 110 Å. Furthermore, the thickness of the dielectric layer 620 can be identical to or different from the dielectric layer 605.

Obvious, in another embodiment, after forming the silicon nitride stacked layer 610 but before forming the dielectric layer 620 may further include forming a dielectric layer (not shown) over the silicon nitride stacked layer 610. The method of forming the dielectric layer includes, for example, performing a chemical vapor deposition process using a material selected from a group consisting of silicon oxide, silicon nitride, silicon carbide, silicon oxynitride, silicon carbon nitride and silicon carbon oxide.

In addition, in one embodiment of the present invention, the dielectric layer 605, the dielectric layer 620 and the silicon nitride stacked layer 610 of the capacitance dielectric layer 600 can be fabricated in the same reaction chamber. In an alternative embodiment, the dielectric layer 605, the dielectric layer 620 and the silicon nitride stacked layer 610 are fabricated in different reaction chambers.

The present invention utilizes the performance of a multiple of consecutive deposition processes to form the silicon nitride stacked layer. Although each silicon nitride layer in the silicon nitride stacked layer may have a number of defects, these defects will cross over each other randomly distributed and hence will not cause problems such as an increase in the leakage current or a decrease in breakdown voltage. Because the present invention can avoid the problems of having a large leakage current and a reduced breakdown voltage, the per unit area capacitance in the capacitance dielectric layer is increased.

In the following, an electrical test on a conventional capacitor and the capacitor according to the present invention is described and compared.

Figure 9:
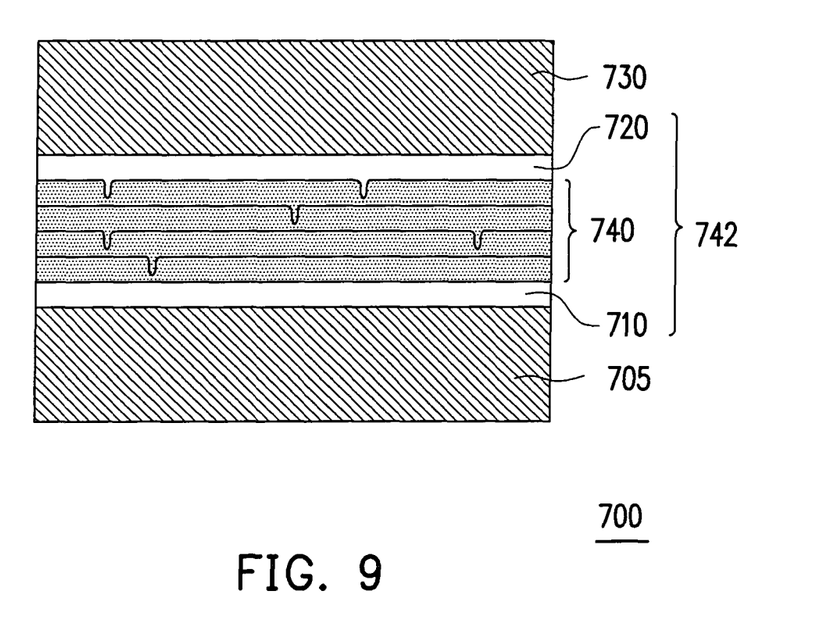
FIG. 9 is a schematic cross-sectional view showing the structure of a capacitor according to one embodiment of the present invention.

FIG. 9 is a schematic cross-sectional view showing the structure of a capacitor according to one embodiment of the present invention. The capacitor 700 as shown in FIG. 9 includes an electrode plate 705, a capacitor dielectric layer 742 and an another electrode plate 730. The capacitor dielectric layer 742 is disposed over the electrode plate 705 and the electrode plate 730 is disposed over the capacitor dielectric layer 742. The electrode plate 705 and the electrode plate 730 are fabricated using a metallic material, for example. The metallic material includes titanium nitride (TiN), titanium (Ti), aluminum (Al), copper (Cu) or a combination of the foregoing materials, for example. The aforementioned capacitor dielectric layer 742 mainly comprises a dielectric layer 710, a silicon nitride stacked layer 740 and a dielectric layer 720. Since the structural design of the capacitor dielectric layer 742 has been explained in a number of foregoing embodiments, a detailed description is omitted here.

Figure 10:
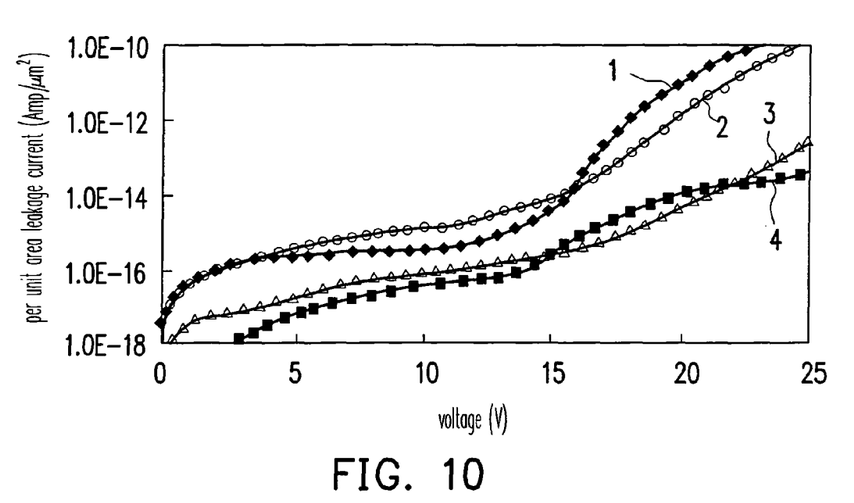
FIG. 10 is a graph with curves showing the relationships between the applied voltage and the per unit area leakage current for a conventional capacitor and a capacitor according to the present invention.
Figure 11:
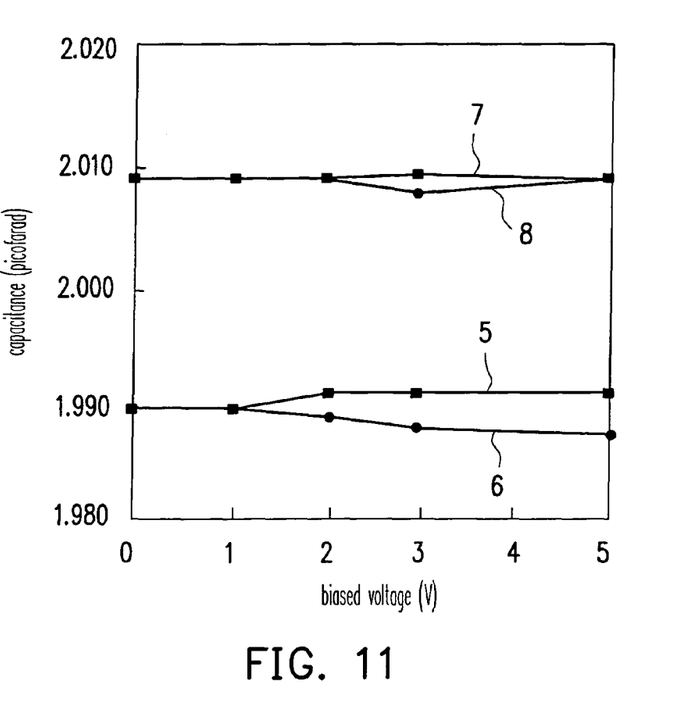
FIG. 11 is a graph with curves showing the relationships between the biased voltage and the capacitance for a conventional capacitor and a capacitor according to the present invention.

FIG. 10 is a graph with curves showing the relationships between the applied voltage and the per unit area leakage current for a conventional capacitor and a capacitor according to the present invention. FIG. 11 is a graph with curves showing the relationships between the biased voltage and the capacitance for a conventional capacitor and a capacitor according to the present invention. As shown in FIG. 10, the X-axis indicates the voltage and the Y-axis indicates the per unit area leakage current. The curve 1 shows the per unit area leakage current when different voltages are applied to the top electrode plate of a conventional capacitor with a single silicon nitride layer. The curve 2 shows the per unit area leakage current when different voltages are applied to the bottom electrode plate of a conventional capacitor with a single silicon nitride layer. On the other hand, the curve 3 shows the per unit area leakage current when different voltages are applied to the top electrode plate of the capacitor with silicon nitride stacked layer in the present invention. The curve 4 shows the per unit area leakage current when different voltages are applied to the bottom electrode plate of the capacitor. It should be noted from FIG. 10 that the per unit area leakage current increases with an increase in the voltage. However, comparing the curves 3 and 4 with the curves 1 and 2, the per unit area leakage current for the curves 3 and 4 are smaller than the curves 1 and 2 when an identical voltage is applied. Furthermore, the curves 3 and 4 are roughly two grade levels lower than the two curves 1 and 2. In other words, the capacitor in the present invention has a leakage current considerably smaller than the conventional capacitor.

As shown in FIG. 11, the X-axis indicates the biased voltage and the Y-axis indicate the capacitance value. The curve 5 shows the capacitance value when different voltages are applied to the top electrode plate of a conventional capacitor with a single silicon nitride layer. The curve 6 shows the capacitance value when different voltages are applied to the bottom electrode plate. On the other hand, the curve 7 shows the capacitance value when different voltages are applied to the top electrode plate of the capacitor with silicon nitride stacked layer in the present invention. The curve 8 shows the capacitance value when different voltages are applied to the bottom electrode plate of the capacitor. It should be noted from FIG. 11 that the variation in the capacitance value between the curves 5 and 6 is much greater than the variation in the capacitance value between the curves 7 and 8. In other words, the capacitance values of the capacitor in the present invention are closer together and have a smaller variation when the biased voltage applied to the top and bottom electrode plate is increased. Thus, the present invention is able to provide a breakthrough in the conventional circuit design that a biased voltage can only be applied the top electrode plate or the bottom electrode plate.

In summary, the advantages of the present invention at least include:

1. The present invention utilizes a multiple of consecutive deposition processes to form a silicon nitride stacked layer. Although each silicon nitride layer in the silicon nitride stacked layer may have a number of defects, these defects will be randomly distributed. Hence, the problems of having an increase in the leakage current and the drop in breakdown voltage can be avoided.

2. With the elimination of the problems of having an increase in the leakage current and the drop in breakdown voltage, the thickness of the capacitance dielectric layer can be further reduced and the per unit area capacitance increased.

3. The present invention also provides a breakthrough in the circuit design because a biased voltage can be applied equally to the top electrode plate and the bottom electrode plate and not just the top electrode plate or the bottom electrode plate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A capacitance dielectric layer, comprising:
   a first dielectric layer;
   a second dielectric layer; and
   a silicon nitride stacked layer disposed between the first dielectric layer and the second dielectric layer, comprising:
   a first silicon nitride layer;
   a second silicon nitride layer; and
   at least a third silicon nitride layer disposed between the first silicon nitride layer and the second silicon nitride layer, wherein the silicon nitride stacked layer comprises only silicon nitride layers.

2. The capacitance dielectric layer of claim 1, wherein the first dielectric layer and the second dielectric layer is fabricated using a material selected from a group consisting of silicon oxide (SiO), silicon nitride (SiN), silicon carbide (SiC), silicon oxynitride (SiON), silicon carbon nitride (SiCN) and silicon carbon oxide (SiCO).

3. The capacitance dielectric layer of claim 1, wherein the capacitance dielectric layer further comprises a third dielectric layer disposed between the first dielectric layer and the silicon nitride stacked layer.

4. The capacitance dielectric layer of claim 3, wherein the third dielectric layer is fabricated using a material selected from a group consisting of silicon oxide, silicon nitride, silicon carbide, silicon oxynitride, silicon carbon nitride and silicon carbon oxide.

5. The capacitance dielectric layer of claim 1, wherein the capacitance dielectric layer further comprises a fourth dielectric layer disposed between the second dielectric layer and the silicon nitride stacked layer.

6. The capacitance dielectric layer of claim 5, wherein the fourth dielectric layer is fabricated using a material selected from a group consisting of silicon oxide, silicon nitride, silicon carbide, silicon oxynitride, silicon carbon nitride and silicon carbon oxide.

7. The capacitance dielectric layer of claim 5, wherein the capacitance dielectric layer further comprises a fifth dielectric layer disposed between the first dielectric layer and the silicon nitride stacked layer.

8. The capacitance dielectric layer of claim 7, wherein the fifth dielectric layer is fabricated using a material selected from a group consisting of silicon oxide, silicon nitride, silicon carbide, silicon oxynitride, silicon carbon nitride and silicon carbon oxide.

9. A capacitor, comprising:
a first electrode plate;
a first dielectric layer disposed over the first electrode plate;
a second dielectric layer disposed over the first dielectric layer;
a second electrode plate disposed over the second dielectric layer; and
a silicon nitride stacked layer disposed between the first dielectric layer and the second dielectric layer, comprising:
a first silicon nitride layer;
a second silicon nitride layer; and
at least a third silicon nitride layer disposed between the first silicon nitride layer and the second silicon nitride layer, wherein the silicon nitride stacked layer comprises only silicon nitride layers.

10. The capacitor of claim 9, wherein the first dielectric layer and the second dielectric layer are fabricated using a material selected from a group consisting of silicon oxide, silicon nitride, silicon carbide, silicon oxynitride, silicon carbon nitride and silicon carbon oxide.

11. The capacitor of claim 9, wherein the capacitor further comprises a third dielectric layer disposed between the first dielectric layer and the silicon nitride stacked layer.

12. The capacitor of claim 9, wherein the third dielectric layer is fabricated using a material selected from a group consisting of silicon oxide, silicon nitride, silicon carbide, silicon oxynitride, silicon carbon nitride and silicon carbon oxide.

13. The capacitor of claim 9, wherein the capacitor further comprises a fourth dielectric layer disposed between the second dielectric layer and the silicon nitride stacked layer.

14. The capacitor of claim 13, wherein the fourth dielectric layer is fabricated using a material selected from a group consisting of silicon oxide, silicon nitride, silicon carbide, silicon oxynitride, silicon carbon nitride and silicon carbon oxide.

15. The capacitor of claim 13, wherein the capacitor further comprises a fifth dielectric layer disposed between the first dielectric layer and the silicon nitride stacked layer.

16. The capacitor of claim 15, wherein the fifth dielectric layer is fabricated using a material selected from a group consisting of silicon oxide, silicon nitride, silicon carbide, silicon oxynitride, silicon carbon nitride and silicon carbon oxide.

17. The capacitor of claim 9, wherein the first electrode plate and the second electrode plate are fabricated using a metallic material.

18. The capacitor of claim 17, wherein the material constituting the metallic material comprises titanium nitride (TiN), titanium (Ti), aluminum (Al), copper (Cu) or a combination of the above.

* * * * *